(12) United States Patent
Weimer

(10) Patent No.: US 7,915,126 B2
(45) Date of Patent: Mar. 29, 2011

(54) METHODS OF FORMING NON-VOLATILE MEMORY CELLS, AND METHODS OF FORMING NAND CELL UNIT STRING GATES

(75) Inventor: Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 684 days.

(21) Appl. No.: 11/706,177

(22) Filed: Feb. 14, 2007

(65) Prior Publication Data

US 2008/0194066 A1    Aug. 14, 2008

(51) Int. Cl.
*H01L 21/336* (2006.01)
(52) U.S. Cl. ........ 438/287; 438/288; 438/591; 438/781; 438/786; 438/790; 438/794; 257/E21.679
(58) Field of Classification Search .................. 438/216, 438/261, 287–288, 591, 781, 786–787, 791, 438/790, 794; 257/E21.679
See application file for complete search history.

(56) References Cited

U.S. PATENT DOCUMENTS

| 2004/0257888 A1* | 12/2004 | Noguchi et al. | 365/200 |
| 2005/0082600 A1* | 4/2005 | Hsu et al. | 257/317 |
| 2005/0088889 A1* | 4/2005 | Lee et al. | 365/202 |
| 2006/0166421 A1* | 7/2006 | Kamioka et al. | 438/197 |
| 2007/0126002 A1* | 6/2007 | Moriya et al. | 257/40 |
| 2007/0166951 A1* | 7/2007 | Arisumi et al. | 438/425 |
| 2008/0003747 A1* | 1/2008 | Choi | 438/258 |
| 2010/0025752 A1* | 2/2010 | Dong | 438/591 |

FOREIGN PATENT DOCUMENTS

JP    59-207812 A  * 11/1984
* cited by examiner

*Primary Examiner* — Mary Wilczewski
*Assistant Examiner* — Toniae M Thomas
(74) *Attorney, Agent, or Firm* — Wells St. John P.S.

(57) ABSTRACT

Some embodiments include methods of utilizing polysilazane in forming non-volatile memory cells. The memory cells may be multi-level cells (MLCs). The polysilazane may be converted to silicon nitride, silicon dioxide, or silicon oxynitride with thermal processing and exposure to an ambient that contains one or both of oxygen and nitrogen. The methods may include using the polysilazane in forming a charge trapping layer of a non-volatile memory cell. The methods may alternatively, or additionally include using the polysilazane in forming intergate dielectric material of a non-volatile memory cell. Some embodiments include methods of forming memory cells of a NAND memory array.

26 Claims, 13 Drawing Sheets

METHODS OF FORMING NON-VOLATILE MEMORY CELLS, AND METHODS OF FORMING NAND CELL UNIT STRING GATES

TECHNICAL FIELD

Methods of forming non-volatile memory cells, and methods of forming NAND cell unit string gates.

BACKGROUND

Memory devices provide data storage for electronic systems. One type of memory is a non-volatile memory known as flash memory. A flash memory is a type of EEPROM (electrically-erasable programmable read-only memory) that may be erased and reprogrammed in blocks. Many modern personal computers have BIOS stored on a flash memory chip. Such a BIOS is sometimes called a flash BIOS. Flash memory is also popular in wireless electronic devices because it enables the manufacturer to support new communication protocols as they become standardized, and to provide the ability to remotely upgrade the device for enhanced features.

A typical flash memory comprises a memory array that includes a large number of memory cells arranged in row and column fashion. The cells are usually grouped into blocks. Each of the cells within a block may be electrically programmed by charging a charge storage gate of the cell. The charge may be removed from the charge storage gate by a block erase operation. Data is stored in a cell as charge in the charge storage gate.

NAND is a basic architecture of flash memory. A NAND cell unit comprises at least one select gate coupled in series to a serial combination of memory cells (with the serial combination being commonly referred to as a NAND string). The gates of the NAND string have traditionally been single level cells (SLCs), but manufacturers are transitioning to utilization of multilevel cells (MLCs) for gates of NAND strings. An SLC stores one bit of memory, whereas an MLC stores two or more bits of memory. Accordingly, memory can be at least doubled by transitioning from SLCs to MLCs.

MLCs differ from SLCs in the programming of the devices. Specifically, a device may be programmed as an SLC if the device is programmed to have only two memory states (0 or 1), with one of the memory states corresponding to one level of stored charge (for example, corresponding to the fully charged device) and the other corresponding to another level of stored charge (for example, corresponding to the fully discharged device). Alternatively, the device may be programmed as an MLC having two bits of memory if the device is programmed to have four memory states. The memory states may be designated as the 00, 01, 10, and 11 memory states, in order from lowest stored charge (for example, fully discharged) to highest stored charge (for example, fully charged). Accordingly, the 00 state corresponds to a lowest stored charge state, the 11 state corresponds to a highest stored charge state, and the 01 and 10 states correspond to first and second intermediate levels of stored charge.

Non-volatile memory cells comprise sub-structures which include a control gate, a charge storage gate (which may be referred to as a floating gate), an intergate dielectric between the control gate and charge storage gate, and a tunnel dielectric between the charge storage gate and an underlying substrate. The charge storage gate may correspond to a material within which charge is mobile (for instance, silicon or conductively-doped silicon), or may correspond to a charge trapping material (for instance, silicon oxynitride). Charge trapping materials offer some advantages relative to other charge storage materials in that they may be formed relatively thin, and therefore may be advantageous for future flash device scaling. However, charge trapping materials formed by conventional methods are difficult to utilize in MLC devices. Specifically, it is desired for MLC devices to have a voltage difference between the lowest stored charge state and the highest stored charge state of at least about 8 volts in order to have four distinct programmable states. It is difficult to obtain such voltage difference with charge-trapping materials formed by conventional methods while simultaneously maintaining desired charge retention characteristics (such as charge retention characteristics associated with 10 year data retention requirements).

BRIEF DESCRIPTION OF THE DRAWINGS

FIGS. 10-14 show diagrammatic cross-sectional views of portions of a semiconductor wafer illustrating another embodiment for forming a NAND cell unit.

DETAILED DESCRIPTION OF THE ILLUSTRATED EMBODIMENTS

Figure 1:
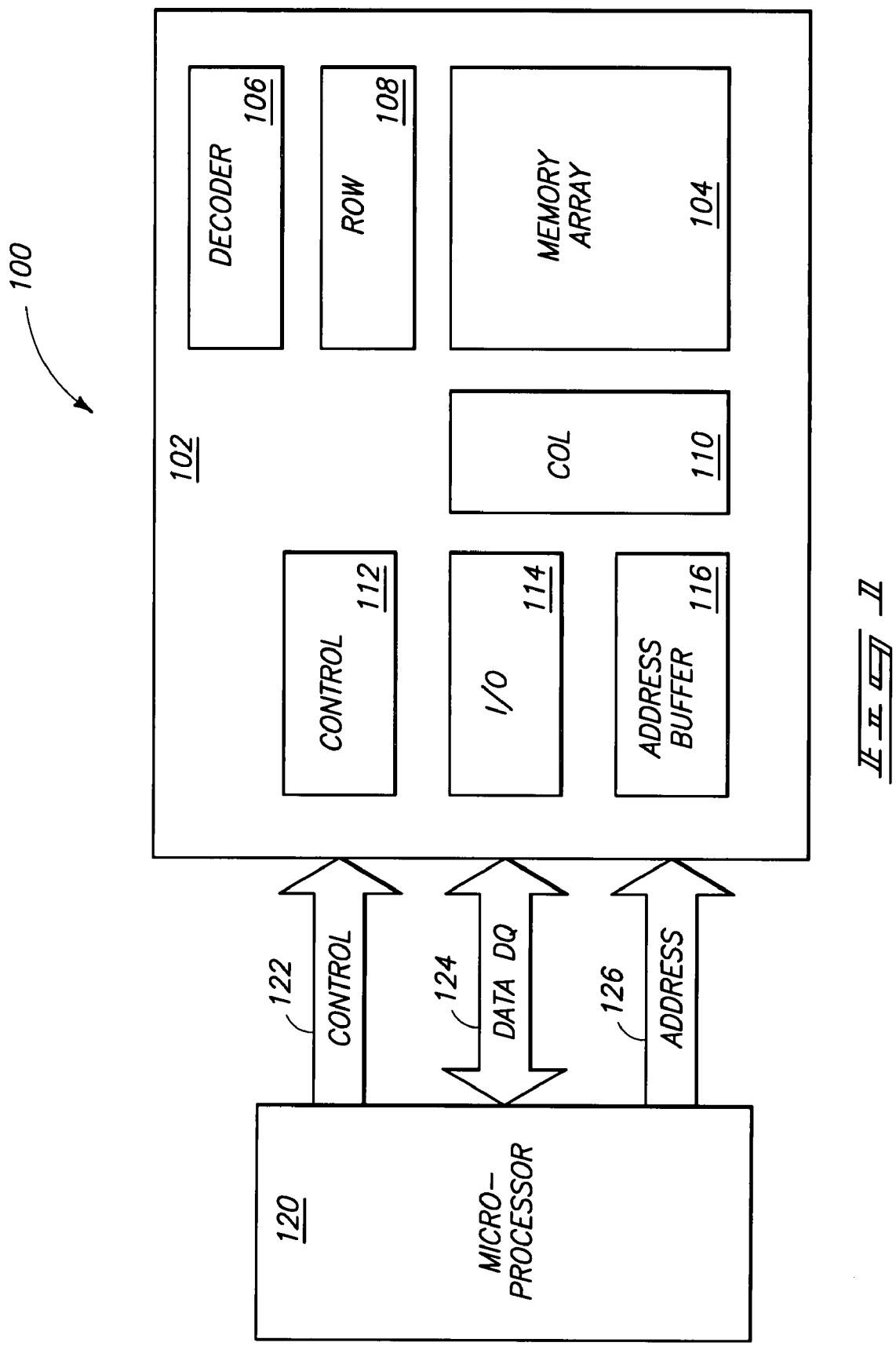
FIG. 1 is a simplified block diagram of a memory system in accordance with an embodiment.

FIG. 1 is a simplified block diagram of a memory system 100, according to an embodiment. Memory system 100 includes an integrated circuit flash memory device 102 (e.g., a NAND memory device), that includes an array of floating-gate memory cells 104, an address decoder 106, row access circuitry 108, column access circuitry 10, control circuitry 112, input/output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that is accessed via a data (DQ) link 124. Address signals are received via an address link 126, and are decoded at address decoder 106 to access the memory array 104. Address buffer circuit 116 latches the address signals. The memory cells may be accessed in response to the control signals and the address signals.

Figure 2:
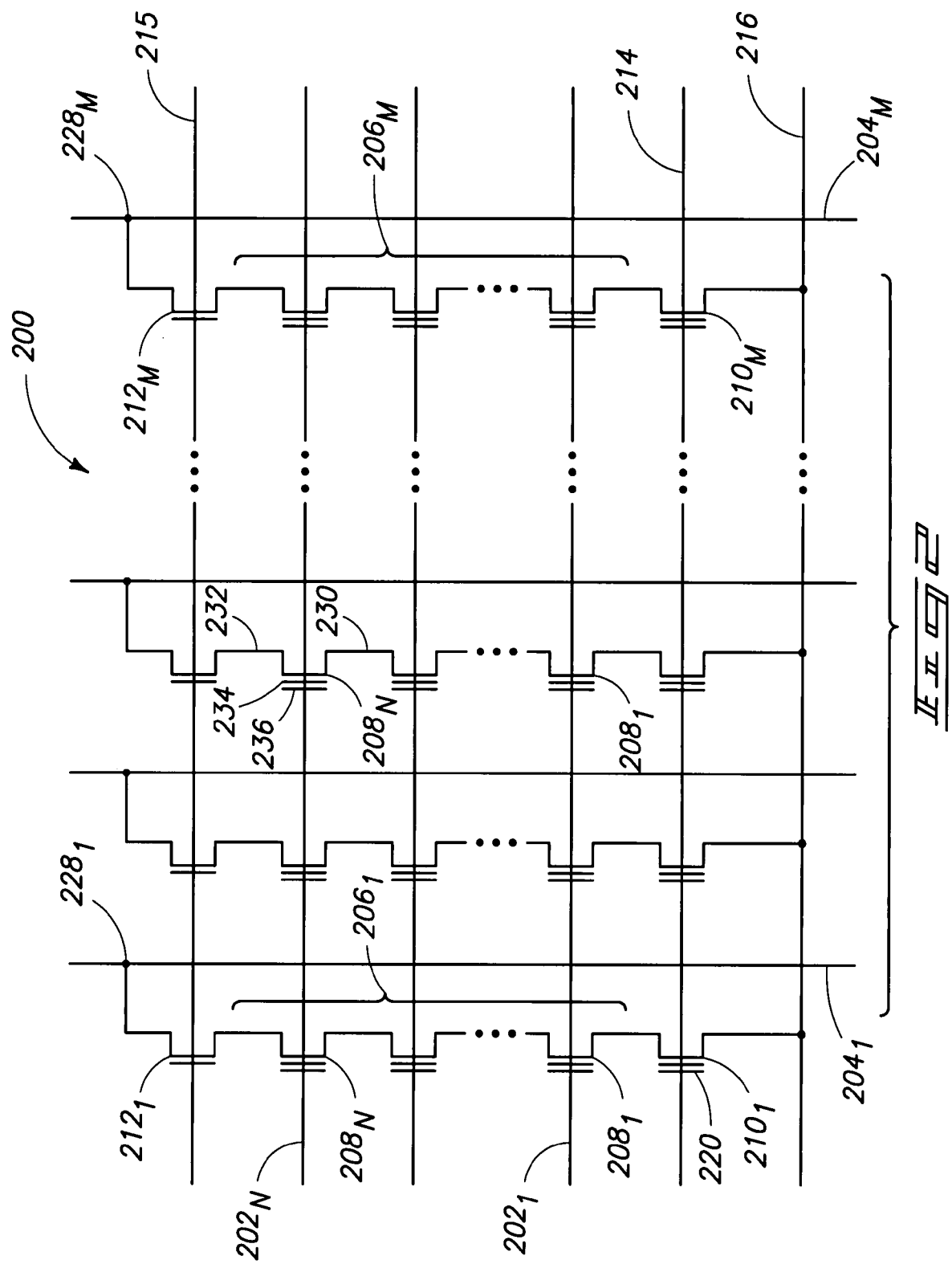
FIG. 2 is a schematic of a NAND memory array in accordance with an embodiment.

FIG. 2 is a schematic of a NAND memory array 200. Such may be a portion of memory array 104 of FIG. 1. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_M$. Each NAND string includes floating gate transistors $208_1$ to $208_N$. The floating gate transistors are located at intersections of wordlines 202 and a local bitlines 204. The floating gate transistors 208 represent non-volatile memory cells for storage of data. The floating gate transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214. The shown embodiment has the drain select gates patterned as field effect transistors and the source select gates patterned as flash cells (i.e., patterned to have floating gates and control gates), but in other embodiments either of the source or drain select gates may be patterned as a flash cell or patterned as a field effect transistor.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $20_1$, at drain contact $228_1$. The source of each drain select gate 212 is connected to the drain of the last floating-gate transistor 208 of the corresponding NAND string 206. For example, the source of drain select gate $212_1$ is connected to the drain of floating gate transistor $208_N$ of the corresponding NAND string $206_1$.

Floating gate transistors 208 include a source 230 and a drain 232, a floating gate 234, and a control gate 236. Floating gate transistors 208 have their control gates 236 coupled to a wordline 202. A column of the floating gate transistors 208 are those NAND strings 206 coupled to a given local bitline 204. A row of the floating gate transistors 208 are those transistors commonly coupled to a given wordline 202.

In some embodiments, polysilazane is utilized in forming one or more sub-structures of a non-volatile memory cell. The polysilazane may, for example, be utilized in forming a charge trapping layer. Alternatively, or additionally, the polysilazane may be utilized in forming at least part of a dielectric. For example, the polysilazane may be utilized in forming at least part of the intergate dielectric.

Polysilazane is a spin on dielectric (SOD). The material has a structural formula of $[SiNR_1R_2NR_3]_n$ where $R_1$, $R_2$ and $R_3$ are all hydrogen in the case of inorganic polysilazane; and are alkyl, aryl or alkoxyl organic moieties in organic polysilazane. The polysilazane may be converted to silicon dioxide by exposure to oxygen, may be converted to silicon nitride by exposure to nitrogen, or may be converted to silicon oxynitride by exposure to oxygen and nitrogen. If the polysilazane is exposed to oxygen, the oxygen may be in the form of, for example, $O_3$, $O_2$, steam, $N_2O$, O, O-containing radicals, and/or other oxidizing agents. If the polysilazane is exposed to nitrogen, the nitrogen may be in the form of, for example, $N_2$ or ammonia.

Figure 3:
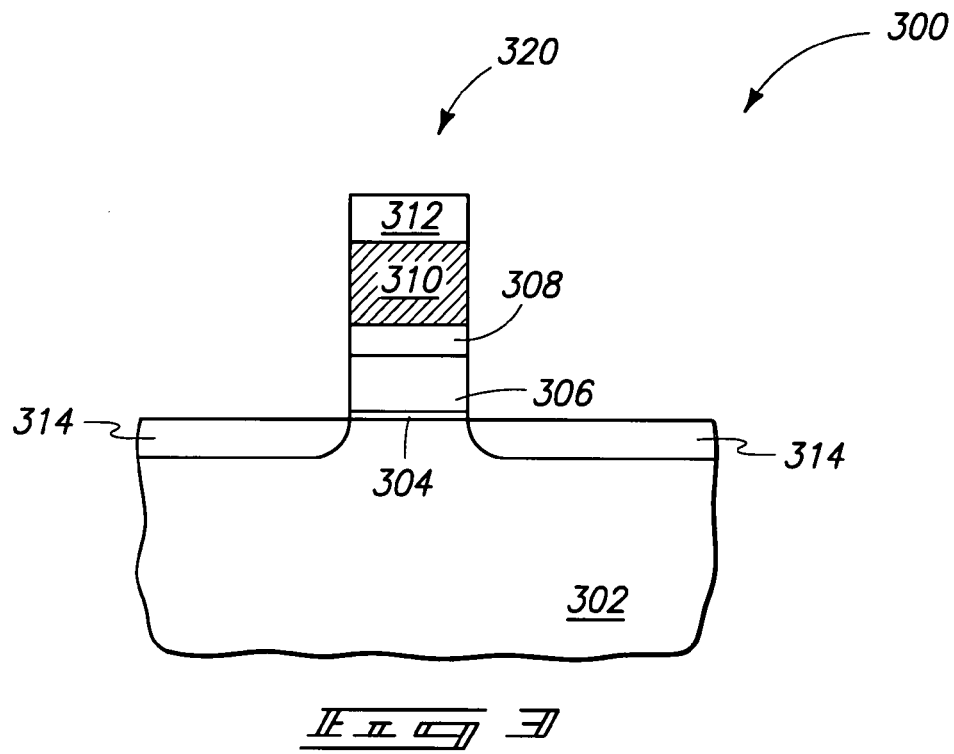
FIG. 3 is a diagrammatic cross-sectional view of a portion of a semiconductor wafer illustrating an embodiment of a non-volatile memory cell.

An example of a non-volatile memory cell formed in accordance with an embodiment is shown in FIG. 3. Specifically, FIG. 3 shows a portion of a semiconductor wafer construction 300 supporting a non-volatile memory cell 320. The semiconductor wafer construction comprises a base 302 which may, for example, comprise, consist essentially of, or consist of monocrystalline silicon lightly doped with appropriate background dopant. Base 302 may be considered to be a substrate. To aid in interpretation of the claims that follow, the terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 302 is shown to be homogenous, it is to be understood that the base may comprise numerous layers in some embodiments. For instance, base 302 may correspond to a semiconductor substrate containing one or more layers associated with integrated circuit fabrication. In such embodiments, the layers may correspond to one or more of barrier layers, diffusion layers, insulator layers, metal-containing interconnect layers, etc.

A gate assembly is over base 302. The gate assembly comprises, in ascending order from base 302, tunnel dielectric material 304, charge storage gate material 306, intergate dielectric 308, control gate material 310, and electrically insulative capping material 312. Although each of the materials 304, 306, 308, 310, and 312 is shown to be homogeneous, various of the materials may comprise multiple layers in some embodiments.

A pair of source/drain regions 314 are within base 302 adjacent the gate assembly. The source/drain regions may correspond to conductively-doped regions of semiconductor base 302, and may be formed by implanting appropriate conductivity-enhancing dopant into the base. The source/drain regions may be primarily p-type doped in some embodiments, and may be primarily n-type doped in other embodiments.

Tunnel dielectric material 304 of non-volatile memory cell 320 may comprise any suitable composition or combination of compositions, and may, for example, comprise, consist essentially of, or consist of silicon dioxide.

Charge storage gate material 306 may comprise any suitable composition or combination of compositions, and may, for example, comprise, consist essentially of, or consist of semiconductor material (for example, silicon), or conductively doped semiconductor material. The charge storage gate material forms a charge storage gate, which may alternatively be referred to as a floating gate.

Intergate dielectric material 308 of non-volatile memory cell 320 comprises at least a portion formed utilizing polysilazane. For instance, the intergate dielectric material may comprise one or more of silicon dioxide, silicon oxynitride, and silicon nitride. In some embodiments, the intergate dielectric material may comprise, consist essentially of, or consist of three layers corresponding to a layer of silicon nitride between a pair of layers of silicon dioxide; and at least one of the three layers may be formed utilizing polysilazane.

The portion of the intergate dielectric material formed utilizing polysilazane may be formed by depositing polysilazane onto an underlying material, and then exposing the polysilazane to one or both of oxygen and nitrogen to convert the polysilazane to one or more of silicon dioxide, silicon nitride and silicon oxynitride. For example, intergate dielectric material 308 may be formed to comprise a silicon nitride layer between a pair of silicon dioxide layers. One of the silicon dioxide layers may be formed directly over the charge storage gate material 306 by deposition of silicon dioxide. The silicon nitride layer may then be formed by depositing polysilazane directly onto the silicon dioxide, and then converting the polysilazane to silicon nitride. The next silicon dioxide layer may then be formed over the silicon nitride. Alternatively, or additionally, one of the silicon dioxide layers may be formed by depositing polysilazane and then converting the polysilazane to silicon dioxide.

Control gate material 310 of non-volatile memory cell 320 may comprise any suitable composition or combination of compositions; and may, for example, comprise, consist essentially of, or consist of one or more of various metals (for instance, tungsten, tantalum or titanium), metal-containing compositions (for instance, metal silicides, metal nitrides, or metal carbonitrides), or conductively-doped semiconductor materials (for instance, conductively-doped silicon).

The electrically insulative capping material 312 of memory cell 320 may comprise any suitable composition or combination of compositions; and may, for example, comprise, consist essentially of, or consist of one or more of silicon dioxide, silicon nitride and silicon oxynitride.

The embodiment of FIG. 3 utilizes polysilazane to form intergate dielectric material. In other embodiments, the polysilazane may be utilized to form charge trapping material of a charge storage gate. A goal of non-volatile memory cell fabrication is to form charge trapping materials having a high number of traps, and also having traps which are deep enough to provide stable retention of charge. Conventional fabrication of silicon nitride or silicon oxynitride charge-trapping materials of non-volatile memory cells are found to produce either materials enriched in silicon that have a high number of shallow traps; or materials enriched in nitrogen that have fewer traps, but with the traps being deeper. It is found that utilization of polysilazane to form a charge-trapping material may yield a material having a better balance between the number of traps and the depth of the traps than is achieved with conventional fabrication of charge-trapping materials. Additionally, it is found that utilization of polysilazane to form a charge-trapping material may lead to a material having suitable properties for utilization in an MLC device. For instance, it is found that the processing described herein for fabrication of charge trapping materials from polysilazane may lead to a charge storage gates with at least an 8 volt separation between a fully charged state and a fully discharged state.

An example of a non-volatile memory cell with a charge-trapping material formed from polysilazane is described with reference to FIG. 4. Similar numbering will be utilized in describing the embodiment of FIG. 4 as is utilized above in describing the embodiment of FIG. 3, where appropriate.

Figure 4:
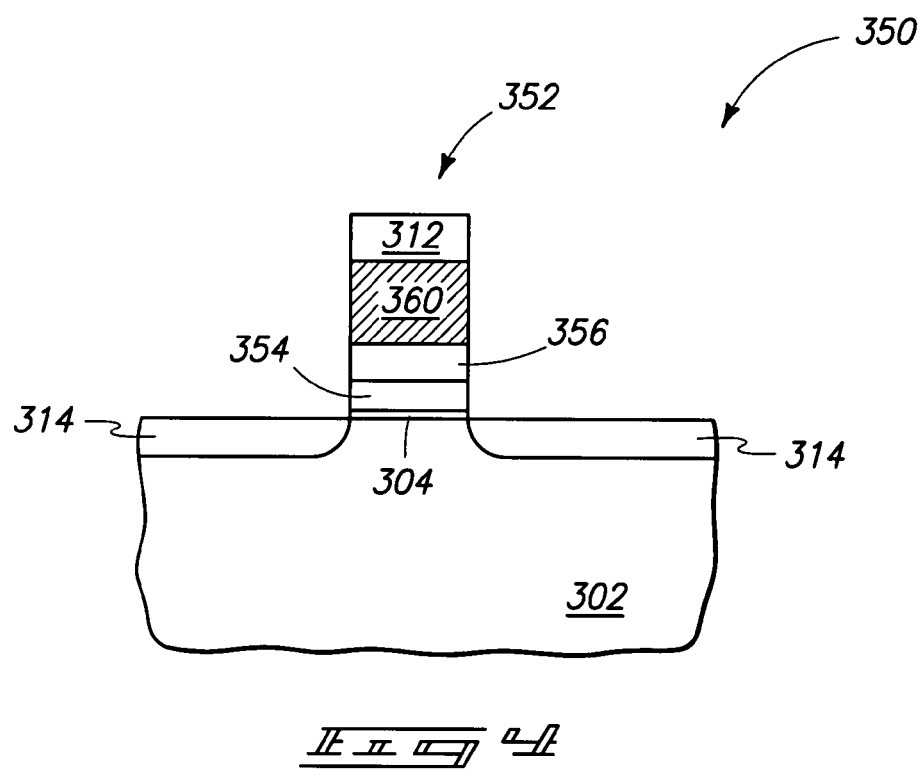
FIG. 4 is a diagrammatic cross-sectional view of a portion of a semiconductor wafer illustrating another embodiment of a non-volatile memory cell.

FIG. 4 shows a semiconductor construction 350 comprising the base 302, and comprising a non-volatile memory cell 352 supported by the base. Non-volatile memory cell 352 includes the tunnel dielectric material 304, insulative capping material 312 and source/drain regions 314 described above with reference to the memory cell 320 of FIG. 3. The non-volatile memory cell 352 also comprises a charge storage gate material 354 over the tunnel dielectric material 304; an intergate dielectric material 356 over material 354, and a control gate material 360 over the intergate dielectric material.

The memory cell 352 is a type of TANOS construction, with intergate dielectric 356 comprising aluminum oxide, and control gate material 360 comprising one or both of tantalum nitride and tantalum carbonitride (with tantalum carbonitride commonly being written as TaCN, but with it being understood that the stoichiometric ratio of Ta to C to N may be other than 1:1:1). The control gate may consist essentially of, or consist of, one or both of tantalum nitride and tantalum carbonitride in some embodiments.

Intergate dielectric material 356 may comprise, consist essentially of, or consist of aluminum oxide, and may also be referred to as a blocking dielectric (due to its blocking of electrons from migrating upwardly out of the trapping material), or may be referred to as a control gate dielectric. In some embodiments, the intergate dielectric material comprises another insulative material in addition to the aluminum oxide. The other dielectric may be silicon dioxide or silicon nitride, for example. In embodiments in which the intergate dielectric material comprises another insulative material in addition to the aluminum oxide, the aluminum oxide may be a back oxide directly against control gate material 360, and the other insulative material may be a front insulative material directly against charge storage gate material 354.

Charge storage gate material 354 is a charge trapping material formed utilizing polysilazane. Such charge trapping material may correspond to one or more of silicon dioxide, silicon nitride and silicon oxynitride.

The TANOS construction is one exemplary construction comprising a control gate containing a metal (with the term "metal" referring to an element selected from the group of elements classified as metals) that may be in elemental form, or which may be incorporated in a compound, and comprising a high-k dielectric material (with a high-k dielectric material being a material with a dielectric constant greater than silicon). In other embodiments, the control gate may comprise any suitable metal, or combination of metals, and may, for example, comprise one or more of tungsten, titanium and tantalum (which may be in elemental form, or may be in the form of compounds, such as nitrides). Also, the dielectric material may comprise any suitable material, and may, for example, comprise an oxide containing oxygen and one or both of aluminum and hafnium (for instance, aluminum oxide ($Al_2O_3$), hafnium oxide ($HfO_2$), and aluminum hafnium oxide ($Al_xHf_yO_z$)).

An example of another non-volatile memory cell with a charge-trapping material formed from polysilazane is described with reference to FIG. 5. Similar numbering will be utilized in describing the embodiment of FIG. 5 as is utilized above in describing the embodiments of FIGS. 3 and 4, where appropriate.

Figure 5:
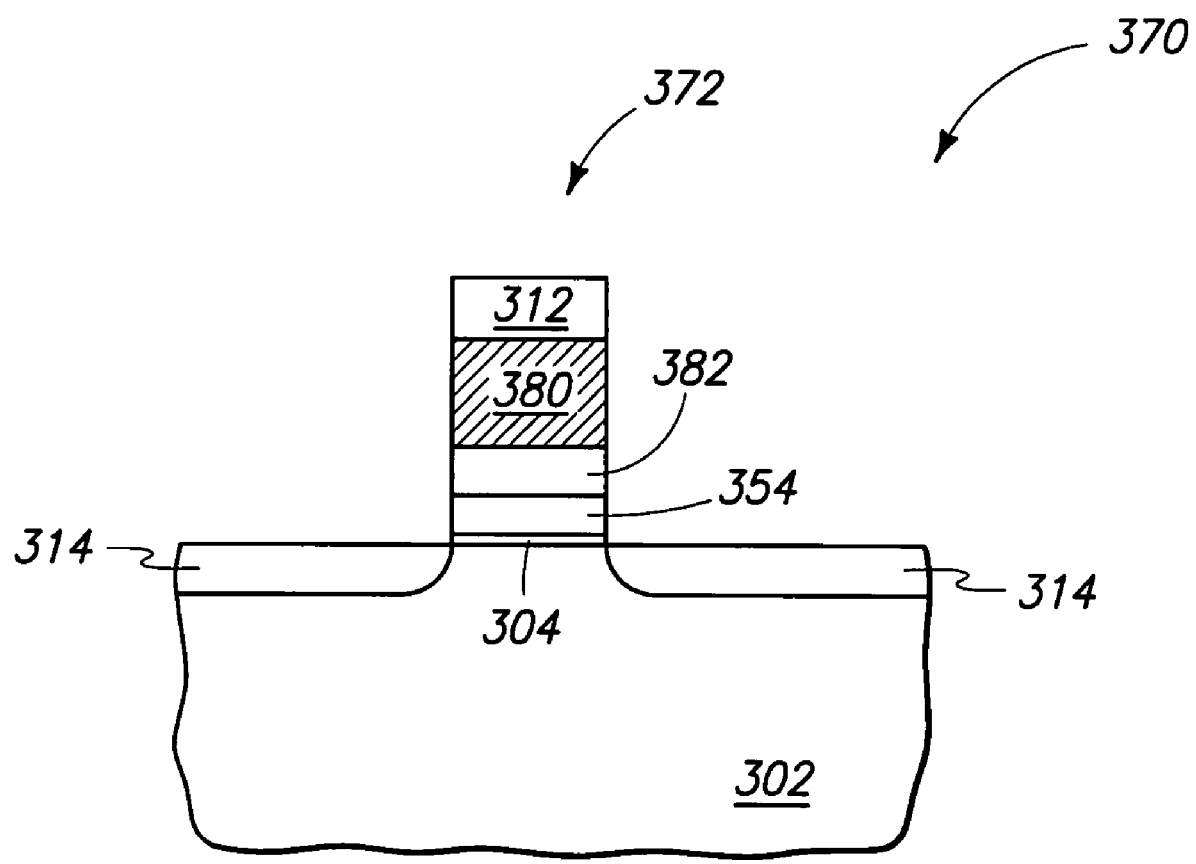
FIG. 5 is a diagrammatic cross-sectional view of a portion of a semiconductor wafer illustrating another embodiment of a non-volatile memory cell.

FIG. 5 shows a semiconductor construction 370 comprising the base 302, and comprising a non-volatile memory cell 372 supported by the base. Non-volatile memory cell 372 includes the tunnel dielectric material 304, insulative capping material 312 and source/drain regions 314 described above with reference to the memory cell 320 of FIG. 3. The non-volatile memory cell 372 also comprises the charge storage gate material 354 discussed above with reference to FIG. 4, and comprises an intergate dielectric material 382 over material 354, and a control gate material 380 over the intergate dielectric material.

The memory cell 372 is a type of SONOS construction, with intergate dielectric 382 comprising silicon oxide, and control gate material 380 comprising, consisting essentially of, or consisting of conductively-doped silicon.

The embodiments of FIGS. 4 and 5 may have advantages and disadvantages relative to one another. For example, the silicon-containing control gate of the SONOS may have a work function which is too low in some applications, which may render the TANOS device to be more suitable for such applications.

In the embodiments of FIGS. 4 and 5, the charge storage gate 354 comprises at least a portion corresponding to a charge trapping region formed utilizing polysilazane. The portion formed utilizing polysilazane may be formed by depositing polysilazane onto an underlying material, and then exposing the polysilazane to one or both of oxygen and nitrogen to convert the polysilazane to one or more of silicon dioxide, silicon nitride and silicon oxynitride. For example, charge storage gate material may be formed by depositing polysilazane directly onto tunnel dielectric material 304, and then converting the polysilazane to silicon oxynitride.

The conversion to silicon oxynitride and/or silicon nitride may comprise thermal treatment of the polysilazane while exposing the polysilazane to an ambient comprising nitrogen, and possibly also oxygen; or may comprise thermal treatment of the polysilazane while sequentially reacting the polysilazane with one of oxygen or nitrogen, and then with the other of oxygen or nitrogen.

In some embodiments, the thermal treatment may comprise first having the polysilazane at a temperature of from about 100° C. to about 400° C. (for example, a temperature of about 150° C.) while exposing the polysilazane to oxygen. The oxygen may be provided by providing an ambient comprising one or more of air, $O_2$ and water. The exposure to the oxygen may incorporate oxygen into the polysilazane, and/or may remove solvent material from the polysilazane. The exposure may be for a time of from about one minute to about 10 minutes (for example, for a time of about three minutes).

The thermal treatment may subsequently comprise heating the polysilazane to a temperature of from about 500° C. to about 1000° C. (for instance, a temperature of about 750° C.) and exposing the polysilazane to an ambient comprising nitrogen and a substantial absence of reactive oxygen. The exposure to the ambient comprising nitrogen may be for a time of from about 10 minutes to about one hour (for instance, for a time of about 30 minutes), and the ambient may comprise one or both of $N_2$ and ammonia. Such exposure may incorporate nitrogen into the polysilazane and/or lock in nitrogen already present in the silazane. If additional nitrogen is desired to be incorporated into the silazane, such may be accomplished with an anneal under an $NH_3$ ambient, and/or utilization of $NH_3$ and plasma conditions.

In some embodiments, the staging time between first thermal treatment to drive off solvents and second thermal treatment to anneal polysilazane may be a parameter of interest to control for final stabilization of correct stoichiometry.

In some embodiments, an entirety of the polysilazane is converted to one or both of silicon oxynitride and silicon nitride with the processing discussed above.

The absence of reactive oxygen (for instance, absence of $O_2$ and $H_2O$) in the nitrogen-containing ambient may preclude the polysilazane from undesired reaction with oxygen which could otherwise form silicon dioxide from the polysilazane. The term "reactive oxygen" is utilized to indicate oxygen-containing species that could react to add oxygen to the polysilazane during the exposure to the nitrogen-containing ambient, as opposed to oxygen-containing species that are non-reactive under such conditions. The nitrogen-containing ambient is referred to as having a "substantial absence" of oxygen to indicate that the reactive oxygen content is reduced to practically achievable levels considering the source of nitrogen and the type of reaction chamber utilized, and may be, but is not limited to, a total absence of detectable reactive oxygen.

In some embodiments, the charge storage gate material may be formed to consist of silicon oxynitride, and may be formed to a thickness of from about 50 Å to about 100 Å. As another example, the charge storage gate material may be formed to consist of silicon nitride, may be formed to a thickness of from about 80 Å to about 85 Å.

Either of the embodiments of FIGS. 4 and 5 may be combined with that of FIG. 3. Specifically, FIG. 3 shows an intergate dielectric formed utilizing polysilazane, while FIGS. 4 and 5 show charge trapping materials formed utilizing polysilazane. In some embodiments, a non-volatile memory cell may be formed utilizing polysilazane for fabrication of a first composition utilized as a charge-trapping material of the memory cell, and for fabrication of a second composition, different from the first composition, utilized as an intergate dielectric material.

The embodiments of FIGS. 3-5 may be incorporated into NAND memory. For instance, any of the non-volatile memory cells of FIGS. 3-5 may be utilized as a flash device of a NAND string.

An example method for incorporating the non-volatile memory cell of FIG. 3 into a NAND string is described with reference to FIGS. 6-9. Similar numbering will be used in describing FIG. 6-9 as was utilized above in describing FIG. 3, where appropriate.

Figure 6:
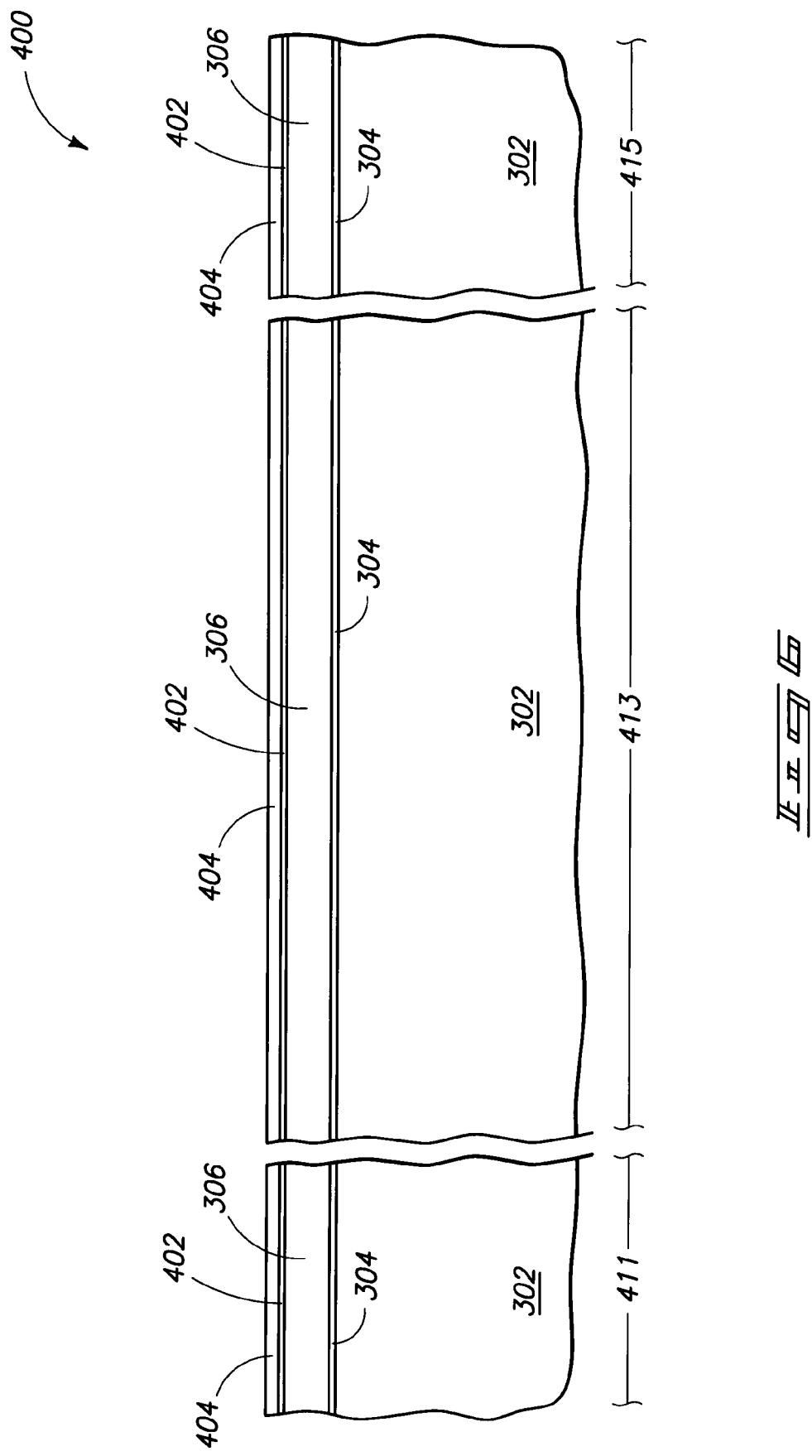
FIGS. 6-9 show diagrammatic cross-sectional views of portions of a semiconductor wafer illustrating an embodiment for forming a NAND cell unit.

FIG. 6 shows three portions 411, 413 and 415 of a semiconductor wafer construction 400. The construction comprises base 302, tunnel dielectric material 304 and charge storage gate material 306.

An electrically insulative material 402 is formed over charge storage gate material 306. The electrically insulative material may, for example, consist of silicon dioxide.

Polysilazane 404 is deposited over insulative material 402. Such deposition may comprise, for example, spin coating.

Figure 7:
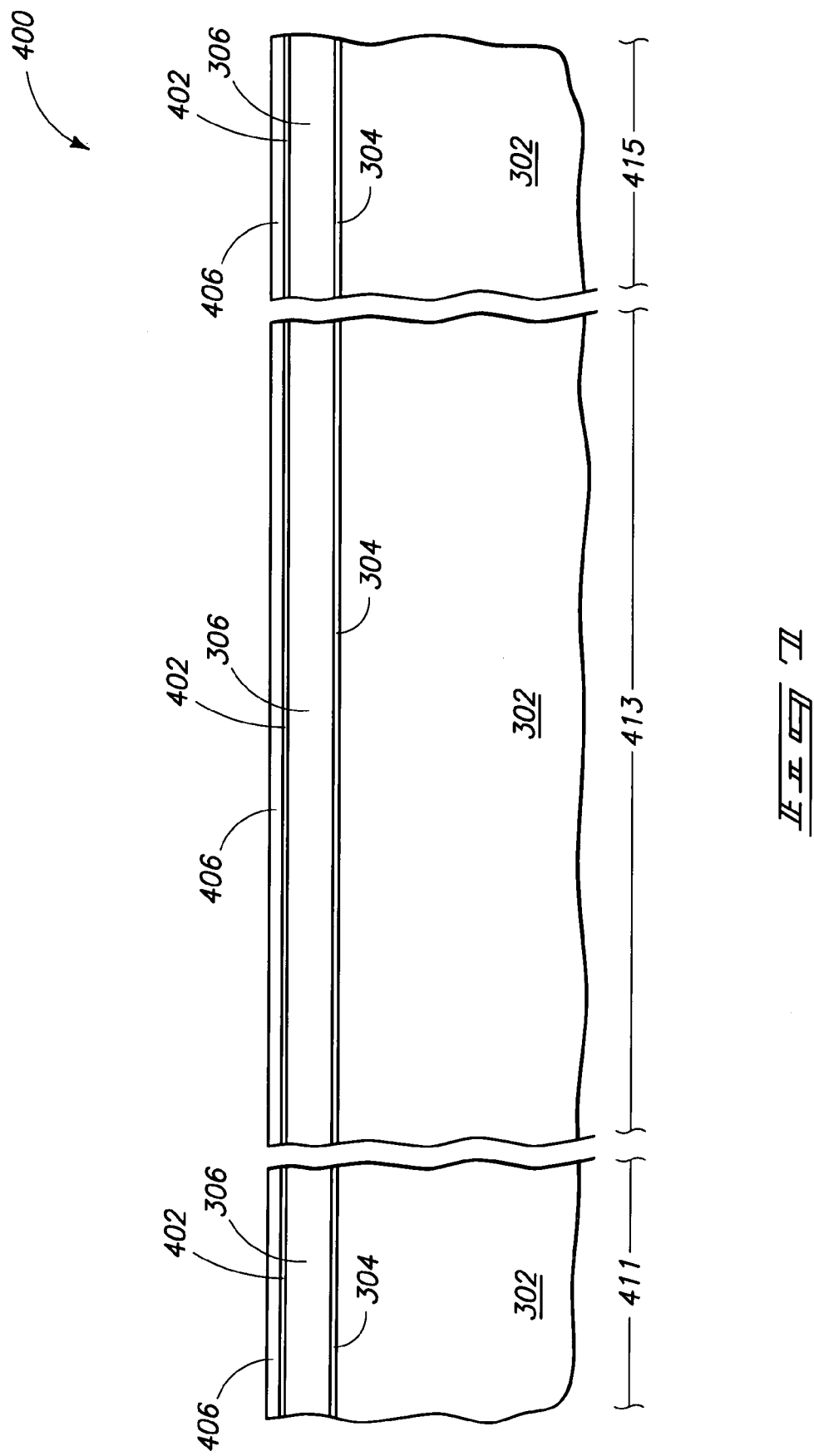

Referring to FIG. 7, the polysilazane 404 (FIG. 6) is converted to insulative material 406. Material 406 may, for example, consist of silicon nitride.

Figure 8:
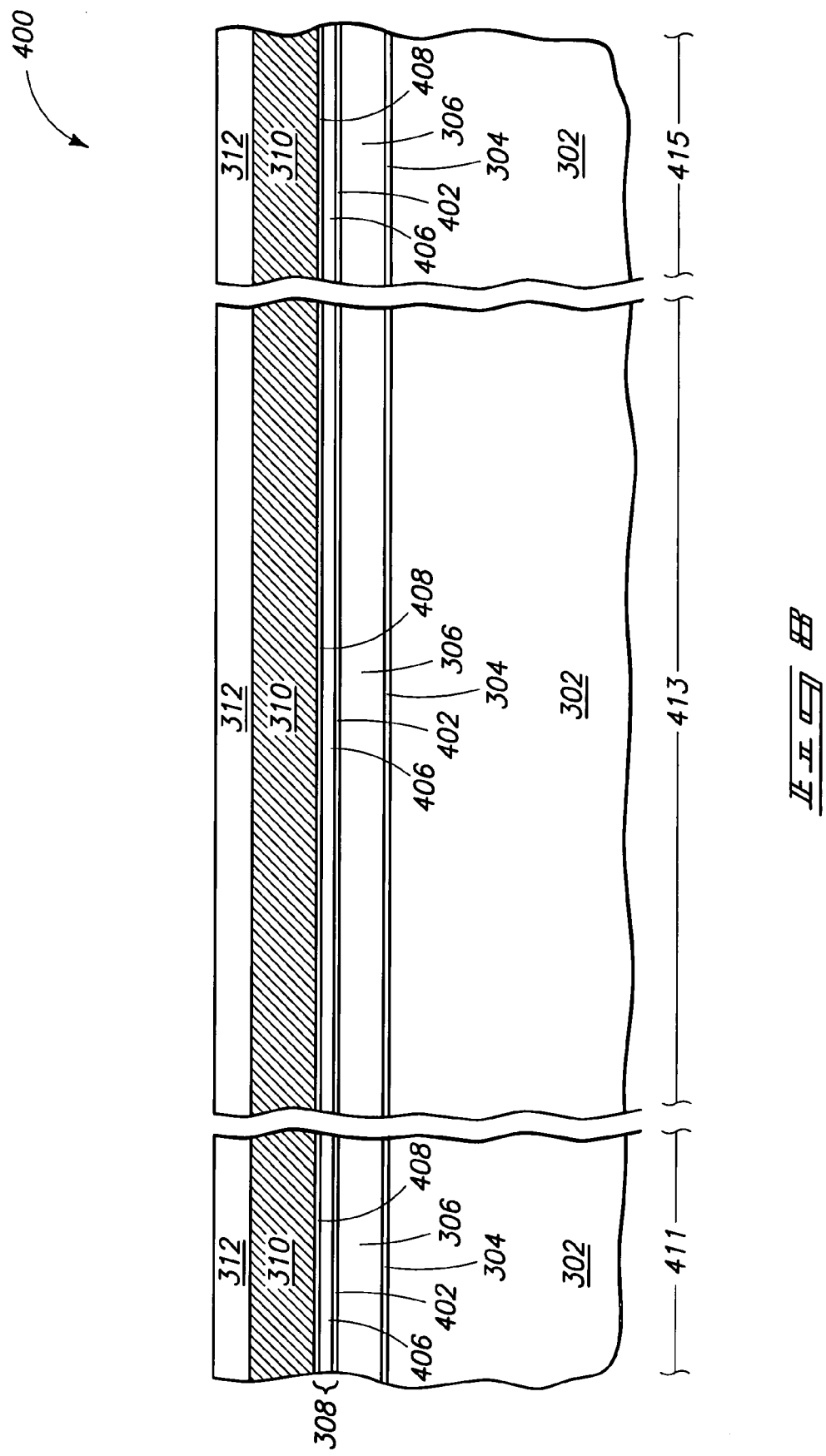

Referring to FIG. 8, a second insulative material 408 is formed over insulative material 406. The second insulative material may, for example, consist of silicon dioxide. The silicon dioxide materials 402 and 408, and silicon nitride material 406, together form the intergate dielectric material 308 discussed above with reference to FIG. 3.

Referring still to FIG. 8, the control gate material 310 and insulative capping material 312 are formed over intergate dielectric material 308.

Figure 9:
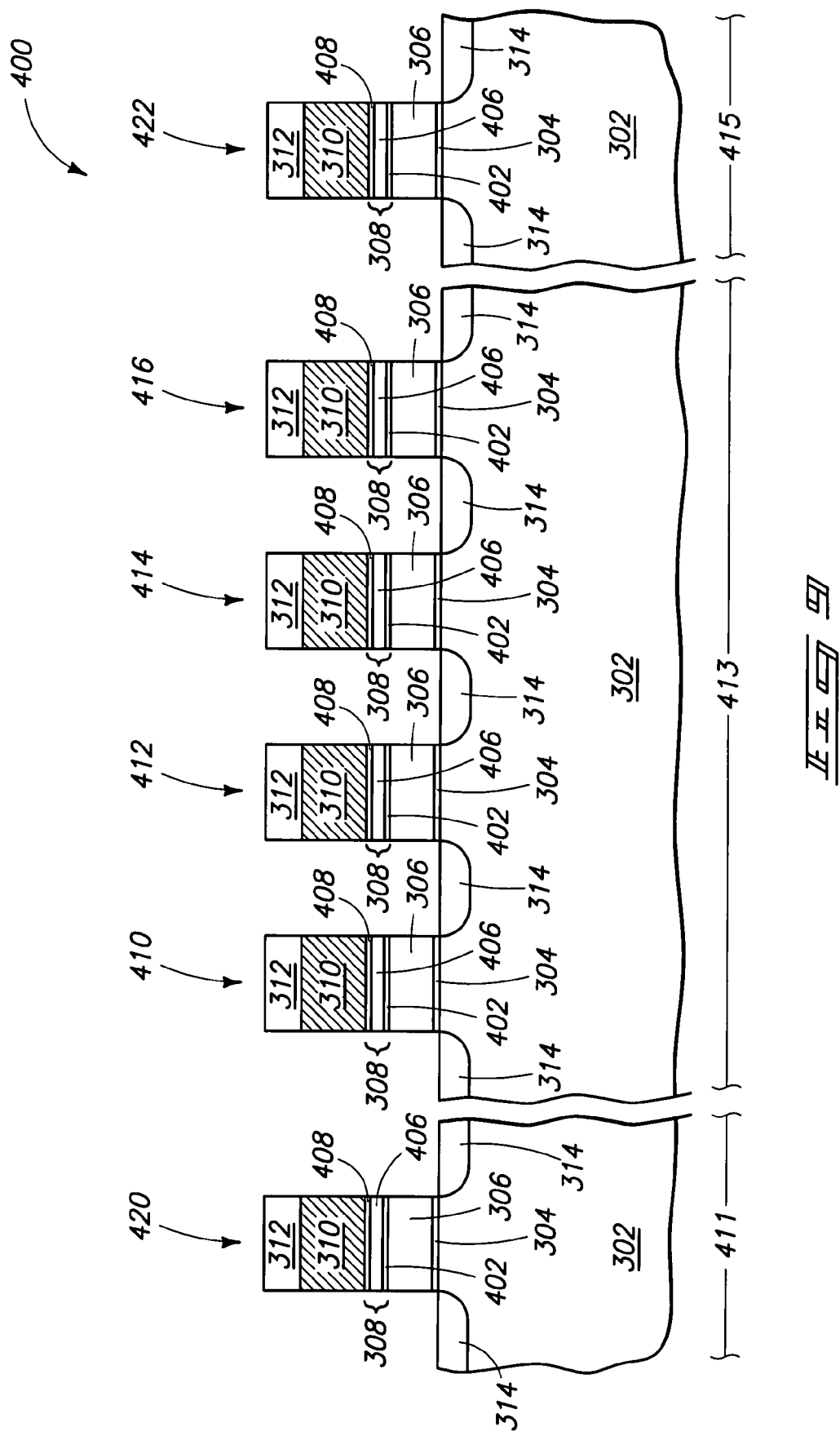

Referring to FIG. 9, the materials 304, 306, 308, 310 and 312 are patterned into a pair of select gates 420 and 422, and a plurality of string gates 410, 412, 414 and 416. The construction 400 is shown subdivided into three portions 411, 413 and 415 to indicate that there may be more than the shown four string gates between the two select gates. In some embodiments there may be exactly four string gates between the two select gates; and in other embodiments there may be less than the four string gates between the two select gates. The patterning of materials 304, 306, 308, 310 and 312 may be accomplished by providing one or more patterned layers over the materials; transferring a pattern from the layers to the materials with one or more suitable etches; and then removing the patterned layers. One of the patterned layers may correspond to photolithographically patterned photoresist.

Source/drain regions 314 are shown formed within base 302 adjacent the select gates and string gates. The source/drain regions may be formed by implanting conductivity-enhancing dopant into base 302 after patterning of the select and string gates.

The select gates 420 and 422 comprise the same materials as the string gates in the embodiment of FIGS. 6-9. In other embodiments, the select gates may be formed separately from the string gates, and may thus comprise different materials than the string gates. For instance, the select gates may be formed as field effect transistors having a single electrically-conductive gate, rather than having the control gate and charge storage gate materials. Also, although the same source/drain regions are shown formed adjacent the select gates as the string gates, in other embodiments the select gate source/drain regions may have different implants in addition to, or alternatively to, the implants utilized to form the source/drain regions of the string gates.

A NAND cell unit of a NAND memory array may be considered to be a plurality of string gates between a pair of select gates; and thus the construction of FIG. 9 may be considered to be an example of a NAND cell unit.

An example method for incorporating either of the non-volatile memory cells of FIGS. 4 and 5 into a NAND string is described with reference to FIGS. 10-14. Similar numbering will be used in describing FIG. 10-14 as was utilized above in describing FIGS. 4 and 5, where appropriate.

Figure 10:
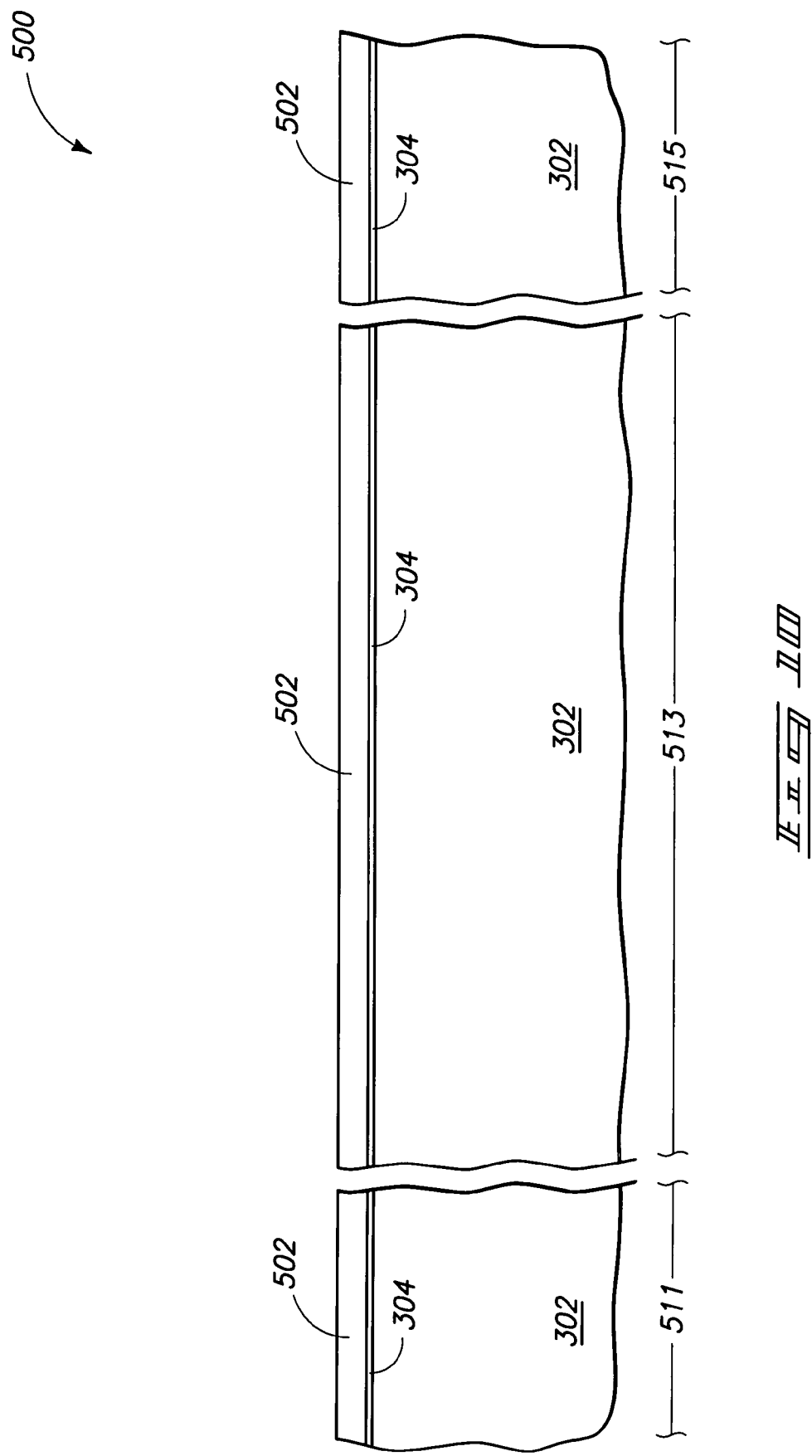

FIG. 10 shows three portions 511, 513 and 515 of a semiconductor wafer construction 500. The construction comprises base 302 and tunnel dielectric material 304. The construction also comprises a polysilazane layer 502 deposited over tunnel dielectric material 304. Such deposition may be accomplished by spin coating.

Figure 11:
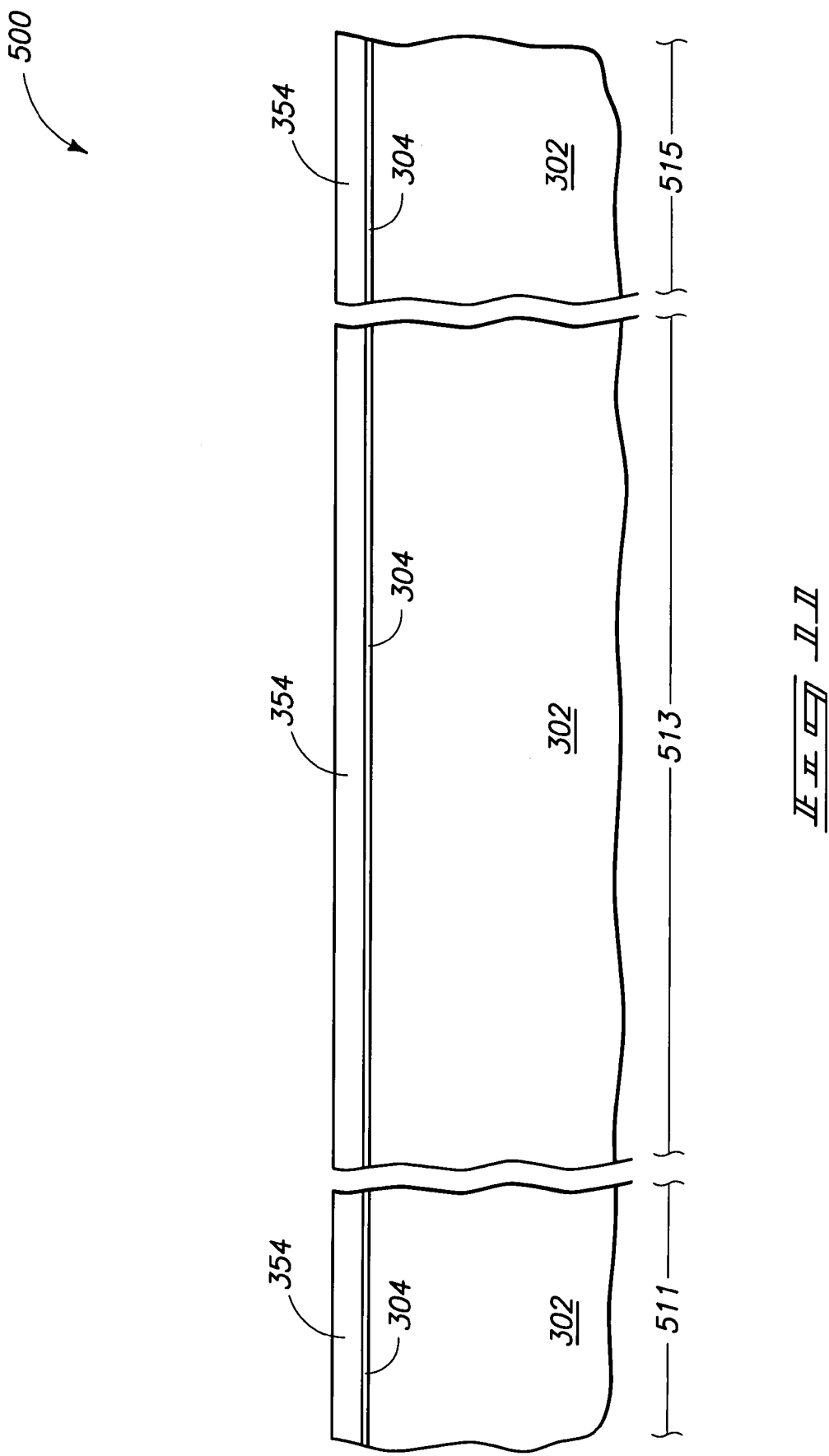

Referring to FIG. 11, the polysilazane 502 (FIG. 10) is converted to charge trapping material 354. The charge trapping material may comprise, consist essentially of, or consist of one or more of silicon dioxide, silicon nitride and silicon oxynitride. The conversion from polysilazane 502 to material 354 may be accomplished by thermal treatment and exposure to one or both oxygen and nitrogen.

Figure 12:
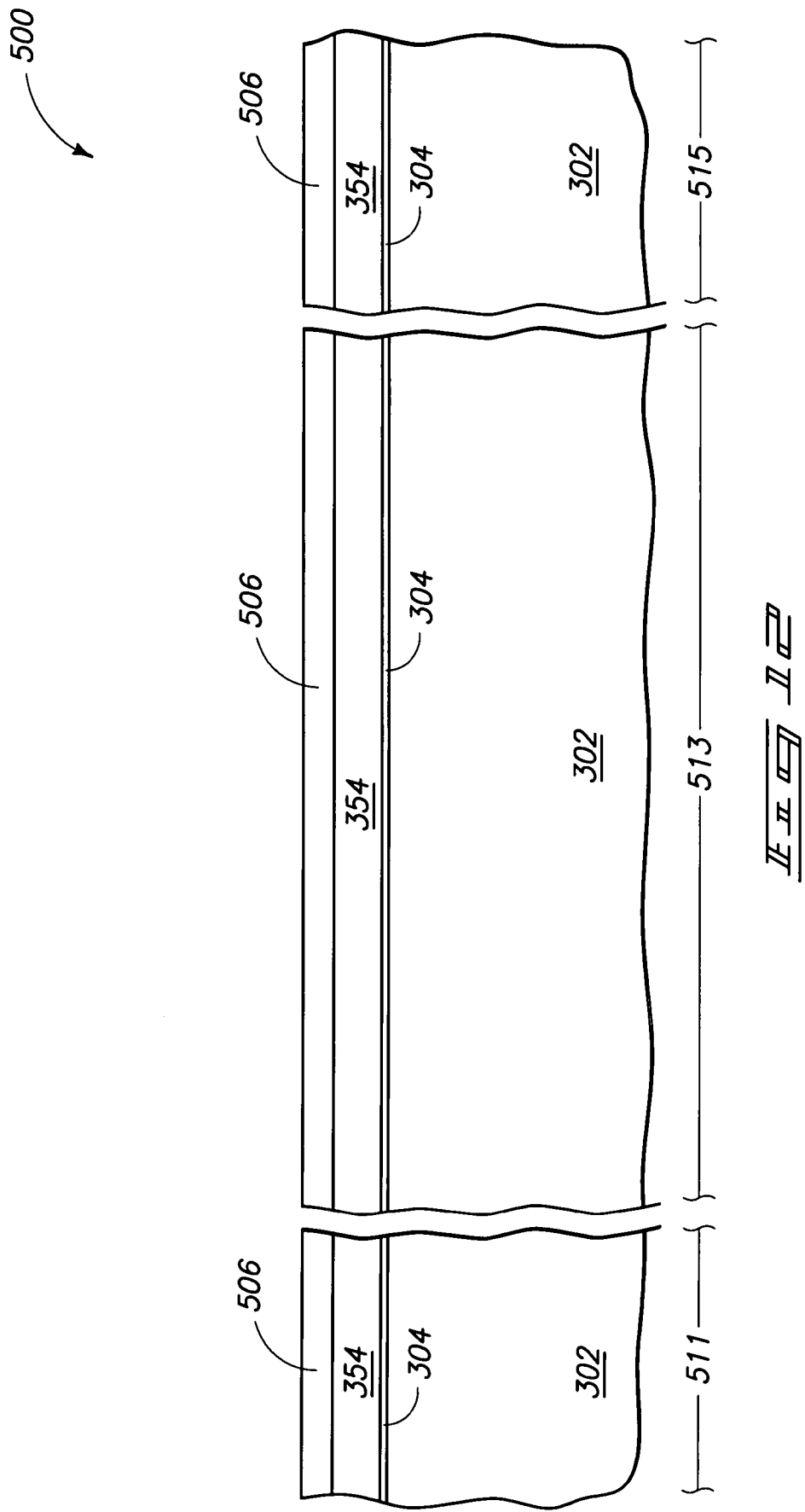
Figure 11:
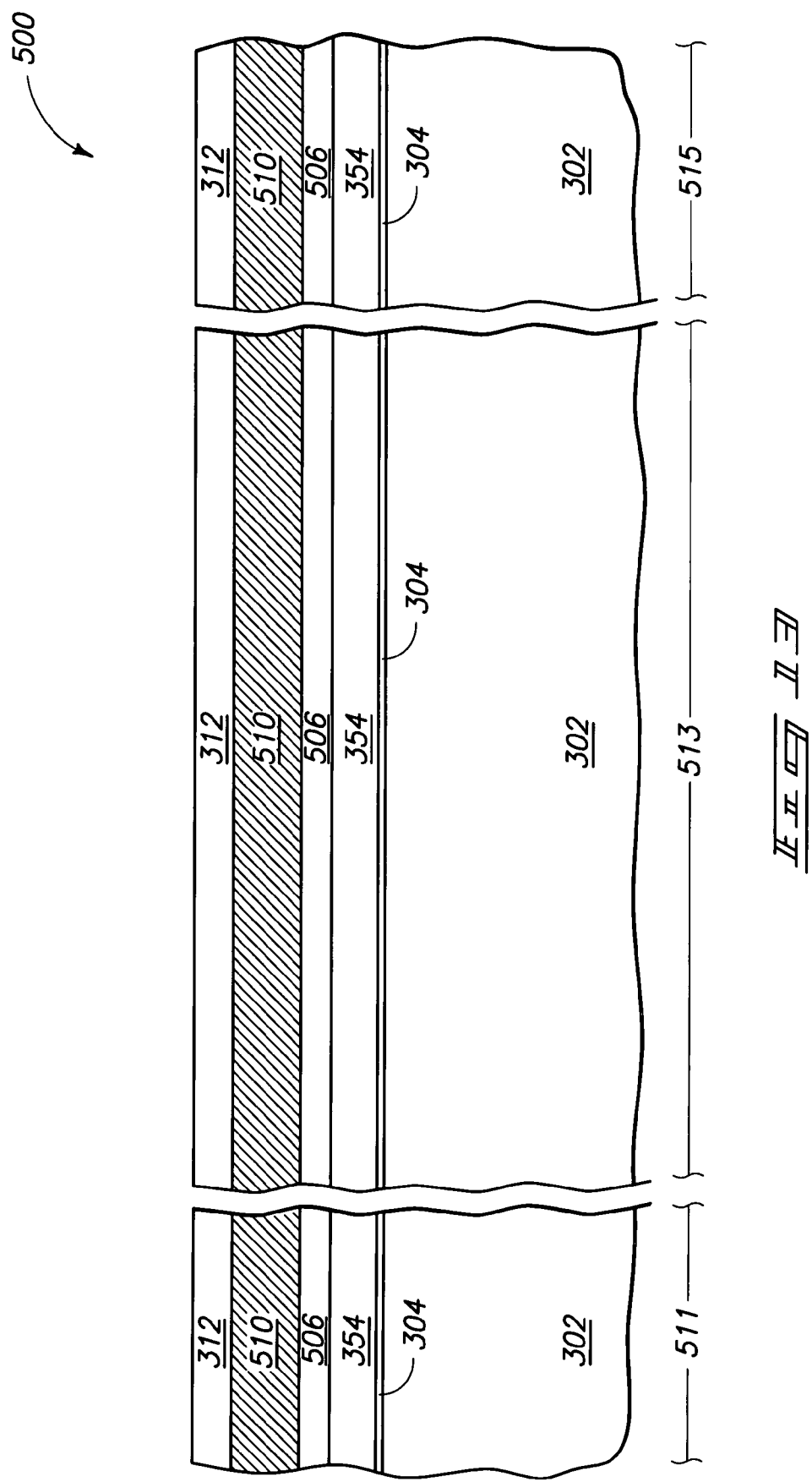
Figure 11:
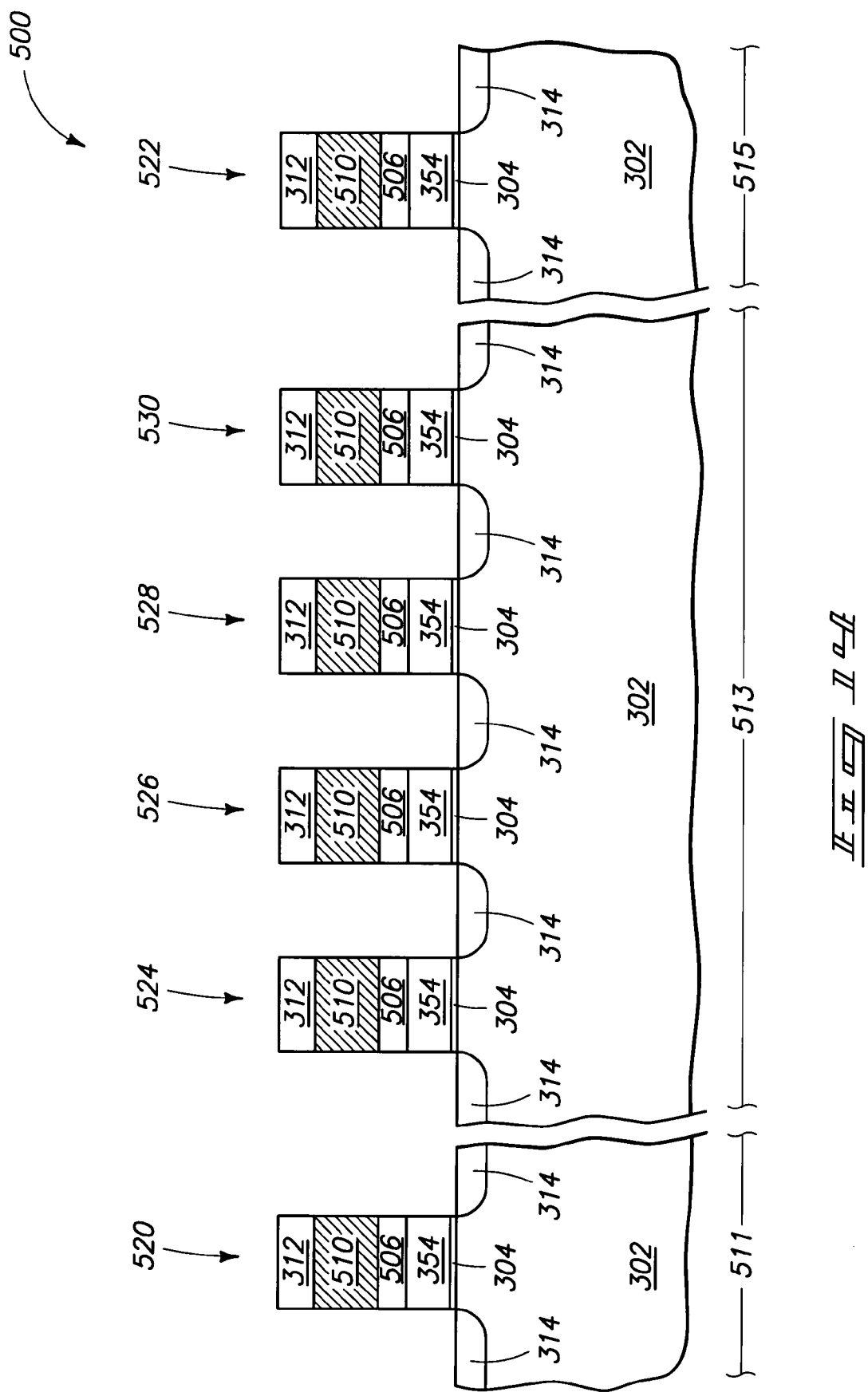

Referring to FIG. 12, intergate dielectric material 506 is formed over material 354. The intergate dielectric material 506 corresponds to material 356 of FIG. 4 or material 382 of FIG. 5, and thus may be silicon dioxide or aluminum oxide.

Referring to FIG. 13, control gate material 510 and insulative capping material 312 are formed over intergate dielectric material 506. The control gate material corresponds to material 360 of FIG. 4 or material 380 of FIG. 5, and thus may be conductively doped silicon; or one or both of TaCN and tantalum nitride.

Referring to FIG. 14, the materials 304, 354, 506, 510 and 312 are patterned into a pair of select gates 520 and 522, and a plurality of string gates 524, 526, 528 and 530. The patterning of materials 304, 354, 506, 510 and 312 may be accomplished by providing one or more patterned layers over the materials; transferring a pattern from the layers to the materials with one or more suitable etches; and then removing the patterned layers. One of the patterned layers may correspond to photolithographically patterned photoresist.

Source/drain regions 314 are shown formed within base 302 adjacent the select gates and string gates. The source/drain regions may be formed by implanting conductivity-enhancing dopant into base 302 after patterning of the select and string gates.

The select gates 520 and 522 comprise the same materials as the string gates in the embodiment of FIGS. 10-14. In other embodiments, the select gates may be formed separately from the string gates, and may thus comprise different materials than the string gates.

Although most of the specific embodiments of FIGS. 3-14 are described relative to utilization of inorganic polysilazane to form silicon nitride, silicon oxynitride or silicon dioxide, in other embodiments organic polysilazane may be utilized.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a non-volatile memory cell comprising using polysilazane in forming at least one sub-structure of the memory cell; the memory cell including a gate dielectric and a control gate; said at least one sub-structure being between the gate dielectric and the control gate; wherein the at least one sub-structure formed utilizing the polysilazane includes a charge trapping layer; and wherein the control gate comprises tantalum carbonitride.

2. A method of forming a non-volatile memory cell, comprising:
    depositing polysilazane over a gate dielectric;
    thermally treating the polysilazane while exposing the polysilazane to an ambient comprising at least one of nitrogen and oxygen; and
    forming a control gate over the thermally-treated polysilazane; wherein the gate dielectric, thermally-treated polysilazane and control gate together form a vertical stack; and wherein the thermally-treated polysilazane is between the gate dielectric and the control gate within the vertical stack.

3. The method of claim 2 wherein the ambient comprises the oxygen, and further comprising providing at least some of the oxygen in the ambient as one or more of $O_3$, NO, $N_2O$, $H_2O$ and $O_2$.

4. The method of claim 2 wherein the ambient comprises the nitrogen, and further comprising providing at least some of the nitrogen in the ambient as one or both of ammonia and $N_2$.

5. The method of claim 2 wherein the ambient comprises both the nitrogen and the oxygen.

6. The method of claim 2 wherein at least some of the polysilazane is converted into silicon dioxide during the thermal treatment.

7. The method of claim 2 wherein at least some of the polysilazane is converted into silicon oxynitride during the thermal treatment.

8. The method of claim 2 wherein at least some of the polysilazane is converted into silicon nitride during the thermal treatment.

9. A method of forming a non-volatile memory cell, comprising:
    depositing polysilazane;
    thermally treating the polysilazane while exposing the polysilazane to an ambient comprising at least one of nitrogen and oxygen;
    forming a control gate over the thermally-treated polysilazane; and
    wherein at least some of the polysilazane is converted into silicon oxynitride during the thermal treatment.

10. A method of forming a non-volatile memory cell, comprising:
    depositing polysilazane;
    thermally treating the polysilazane while exposing the polysilazane to an ambient comprising at least one of nitrogen and oxygen;
    forming a control gate over the thermally-treated polysilazane; and
    wherein at least some of the polysilazane is converted into silicon nitride during the thermal treatment.

11. A method of forming a non-volatile memory cell, comprising:
    forming a gate dielectric over a semiconductor substrate;

forming a charge trapping material over the gate dielectric, the forming the charge trapping material comprising deposition of polysilazane onto the gate dielectric material;

forming intergate dielectric over the charge trapping material; and forming a control gate over the intergate dielectric.

12. The method of claim 11 wherein the forming the charge trapping material further comprises thermally treating the polysilazane while exposing the polysilazane to an ambient comprising at least one of nitrogen and oxygen.

13. The method of claim 12 wherein the ambient comprises the oxygen, and wherein the charge trapping material comprises one or both of silicon dioxide and silicon oxynitride.

14. The method of claim 12 wherein the ambient comprises the nitrogen, and wherein the charge trapping material comprises one or both of silicon nitride and silicon oxynitride.

15. The method of claim 12 wherein the ambient comprises both the nitrogen and the oxygen.

16. A method of forming NAND cell unit string gates, comprising:

forming a first dielectric material over a semiconductor substrate;

forming polysilazane over the first dielectric material;

converting the polysilazane to one or more of silicon dioxide, silicon nitride or silicon oxynitride, the converted polysilazane being a charge trapping material;

forming a second dielectric material over the charge trapping material;

forming control gate material over the second dielectric material; and patterning the first dielectric material, charge trapping material, second dielectric material and control gate material into one or more NAND cell unit string gates.

17. The method of claim 16 wherein the individual NAND string gates have at least an 8 volt separation between fully charged states and fully discharged states.

18. The method of claim 16 wherein the second dielectric material comprises aluminum oxide.

19. The method of claim 16 wherein the second dielectric material comprises silicon dioxide.

20. The method of claim 16 wherein the control gate material comprises a metal, which may be in elemental form or may be part of a compound; and wherein the second dielectric material comprises a high-k dielectric material.

21. The method of claim 20 wherein the metal comprises one or more of tantalum, titanium and tungsten.

22. The method of claim 20 wherein the high-k dielectric material comprises an oxide containing oxygen and one or both of aluminum and hafnium.

23. The method of claim 16 wherein the control gate material comprises tantalum carbonitride and the second dielectric material comprises aluminum oxide.

24. The method of claim 23 wherein the aluminum oxide is the only material between the converted polysilazane and the control gate material.

25. The method of claim 16 wherein the control gate material comprises conductively-doped silicon and the second dielectric material comprises silicon dioxide.

26. The method of claim 16 wherein the converting the polysilazane comprises thermally treating the polysilazane while exposing the polysilazane to one or both of oxygen and nitrogen.

* * * * *